(12) United States Patent
Bergsma

(10) Patent No.: US 10,476,507 B2
(45) Date of Patent: *Nov. 12, 2019

(54) METHOD AND APPARATUS FOR CONFIGURABLE CONTROL OF AN ELECTRONIC DEVICE

(71) Applicant: SKYWORKS SOLUTIONS, INC., Woburn, MA (US)

(72) Inventor: Adrian John Bergsma, Kanata (CA)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/256,185

(22) Filed: Jan. 24, 2019

(65) Prior Publication Data

US 2019/0158094 A1 May 23, 2019

Related U.S. Application Data

(63) Continuation of application No. 15/809,462, filed on Nov. 10, 2017, now Pat. No. 10,193,556.

(60) Provisional application No. 62/420,632, filed on Nov. 11, 2016.

(51) Int. Cl.
*H03K 19/173* (2006.01)

(52) U.S. Cl.
CPC ............... *H03K 19/1737* (2013.01)

(58) Field of Classification Search
CPC .................................. H03K 19/1737
USPC .......................................... 326/38
See application file for complete search history.

(56) References Cited

U.S. PATENT DOCUMENTS

| 5,329,431 A * | 7/1994 | Taylor ............... G05B 19/0421 315/316 |
| 5,998,985 A * | 12/1999 | Gallavan ............ G01R 13/405 324/133 |
| 6,700,922 B2 * | 3/2004 | Challa ............... H04B 17/0085 375/147 |
| 7,106,227 B2 * | 9/2006 | Karlquist ............. H04J 3/047 341/101 |
| 7,164,416 B1 * | 1/2007 | Fullman .................. G09G 3/20 345/204 |
| 8,373,364 B2 * | 2/2013 | Santo ................. G01R 31/2635 315/185 R |
| 8,390,320 B2 | 3/2013 | Jansen et al. |
| 8,928,247 B2 | 1/2015 | Cheon et al. |
| 9,538,597 B2 * | 1/2017 | Chen .................. H05B 33/0842 |
| 9,658,607 B2 | 5/2017 | Coogan et al. |
| 9,791,543 B2 * | 10/2017 | Ryan ......................... G01S 5/16 |
| 9,800,143 B2 * | 10/2017 | Wu .......................... H02J 7/345 |
| 2004/0160199 A1 | 8/2004 | Morgan et al. |

(Continued)

*Primary Examiner* — Don P Le

(74) *Attorney, Agent, or Firm* — Lando & Anastasi, LLP

(57) ABSTRACT

Methods and apparatuses are provided for establishing operational states of a device having a plurality of functional operating units. An input is configured to receive an identifier of a desired operational state of the device. A number of control outputs are configured to couple to one or more of the plurality of functional operating units having two or more operational states. A number of reference inputs are each configured to receive a reference signal, and at least one reference signal is mapped, based on the identifier, to at least one control output. Each control output provides a control signal that places each functional operating unit in a selected state to achieve the desired operational state of the device.

20 Claims, 8 Drawing Sheets

(56) References Cited

U.S. PATENT DOCUMENTS

2015/0115805 A1* 4/2015 Henig ................ H05B 37/0227
                                                      315/152
2015/0359073 A1   12/2015 Van De Sluis et al.
2016/0127875 A1    5/2016 Zampini, II
2017/0294964 A1   10/2017 Ryan et al.

* cited by examiner

METHOD AND APPARATUS FOR CONFIGURABLE CONTROL OF AN ELECTRONIC DEVICE

CROSS-REFERENCE TO RELATED APPLICATIONS

This application is a continuation of and claims the benefit under 35 U.S.C. § 120 of co-pending U.S. patent application Ser. No. 15/809,462 titled METHOD AND APPARATUS FOR CONFIGURABLE CONTROL OF AN ELECTRONIC DEVICE, filed on Nov. 10, 2017, which claims the benefit under 35 U.S.C. § 119(e) of U.S. Provisional Patent Application No. 62/420,632 titled METHOD AND APPARATUS FOR CONFIGURABLE CONTROL OF AN ELECTRONIC DEVICE, filed on Nov. 11, 2016, each of which is hereby incorporated by reference in its entirety for all purposes.

BACKGROUND

Many electronic devices support multiple operational states. For example, digital switched attenuators may selectively reduce the power of a signal, such as a radio frequency signal, by a certain attenuation level selected by a user or a master device. Signal couplers may have frequency components, or parameters such as coupling factor or directionality, that may be adjustable and selectable, placing the signal couplers in any of various operational states. Signal amplifiers may have varying selectable states to provide various gain levels, or other selectable operational parameters or states. Electronic devices and components such as these may incorporate logic circuits that control individual elements whose individual operational status determines the operational state of the device or component. Conventional logic circuits that control the operational states of a device allow little, if any, re-configuration, and may be complex and/or expensive to design.

SUMMARY

Aspects and examples are directed to one or more controllers and control methods to control an electronic device to establish operational states of the electronic device. The controllers and control methods described herein allow a level of configurability that may allow alteration of various control aspects without requiring new logic circuits, design, and/or fabrication of the controller.

According to one aspect, a configurable controller for establishing operational states of a device having a plurality of functional operating units is provided and includes an input configured to receive an identifier of a desired operational state of the device, a plurality of control outputs, each of the control outputs configured to couple to one or more of the plurality of functional operating units each having two or more operational states, and a plurality of reference inputs each configured to receive a reference signal, at least one reference signal being mapped, based on the identifier, to at least one control output to provide a control signal that places each functional operating unit in a selected state of its two or more operational states to achieve the desired operational state of the device.

In certain embodiments, a multiplexer provides one or more of the plurality of control outputs.

In some embodiments, one or more of the plurality of reference inputs is coupled to a reference potential, a register, a memory, or a logic circuit.

Some embodiments include a reference source, at least one of the plurality of reference inputs being coupled to the reference source. The reference source may be a reference potential, a register, a memory, or a logic circuit. In certain embodiments, the reference source is a combination of two or more of a reference potential, a register, a memory, and a logic circuit.

According to another aspect, a configurable controller for a device having a number of control lines is provided and includes a plurality of reference inputs configured to receive a reference signal, a plurality of multiplexers, each multiplexer configured to provide a control signal to at least one of the control lines based upon the reference signal received at a selected reference input, and a control input to receive an identifier of a desired operational state of the device, the control input coupled to each of the plurality of multiplexers to select the selected reference input based on the identifier.

In some embodiments, one or more of the plurality of reference inputs is coupled to a reference potential, a register, a memory, or a logic circuit.

Some embodiments include a reference source, at least one of the plurality of reference inputs being coupled to the reference source. The reference source may be a reference potential, a register, a memory, or a logic circuit. In certain embodiments, the reference source is a combination of two or more of a reference potential, a register, a memory, and a logic circuit.

In some embodiments, each of the plurality of multiplexers is coupled to a number of the reference inputs equal to at least the number of operational states of the device.

According to another aspect, a method of designing a controller for a device having a plurality of control lines is provided and includes selecting an m-to-1 multiplexer, where m is greater than or equal to a number of desired operational states of the device, replicating the m-to-1 multiplexer k times, where k is a number of the plurality of control lines and providing the m-to-1 multiplexers in a group configured to control the device.

Some embodiments include coupling an output of each of the m-to-1 multiplexers to one of the plurality of control lines.

Some embodiments include coupling one or more inputs of each of the m-to-1 multiplexers to a reference source. In certain embodiments, the reference source may be a reference potential, a register, a memory, a logic circuit, or any combination of these.

In certain embodiments, providing the m-to-1 multiplexers in a group includes packaging the m-to-1 multiplexers, the packaging providing an output of each of the m-to-1 multiplexers and a first input coupled to a control input of each of the m-to-1 multiplexers. Packaging the m-to-1 multiplexers may include providing a plurality of second inputs, each of the second inputs coupled to one or more inputs of each of the m-to-1 multiplexers.

According to another aspect, a method of controlling a device having a plurality of control lines is provided that includes receiving an identifier that indicates a desired operational state of the device, selecting a reference signal from among a plurality of reference signals based upon the identifier, and providing a control signal to at least one of the plurality of control lines based upon the selected reference signal.

Providing a control signal to at least one of the plurality of control lines may include coupling the selected reference signal to the at least one of the plurality of control lines.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, identical or nearly identical components illustrated in various figures may be represented by like numerals. For purposes of clarity, not every component may be labeled in every figure. In the figures.

DETAILED DESCRIPTION

Aspects and examples are directed to one or more controllers and control methods to control an electronic device to establish operational states of the electronic device. The methods of control and controllers include reference inputs to be mapped, or coupled, to control line outputs whose signals affect one or more operational states of one or more elements (functional operating units) of a controlled device. The methods and controllers allow configurability based upon the reference inputs. Signals received at the reference inputs may be easily altered to cause the controller to establish differing operational states of the controlled device without the need for re-design of controller logic, which may be time-consuming and expensive.

It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
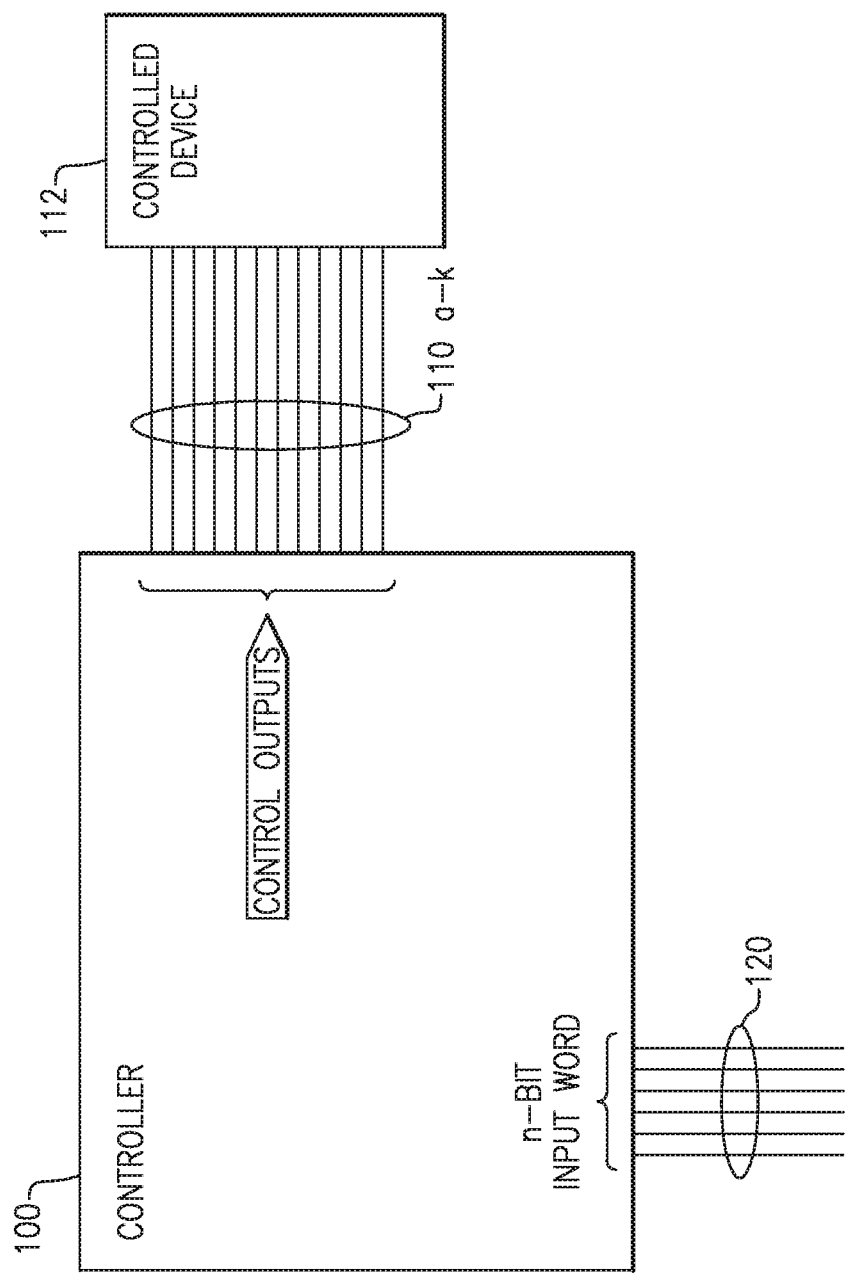
FIG. 1 is a schematic diagram of an example controller.

FIG. 1 illustrates a controller 100 having control outputs 110 coupled to a controlled device 112. Each of the control outputs 110 provides a control signal to one or more functional operating units (FOU) of the controlled device 112. The various control signals provided to FOU's may establish an operational state of the FOU's and, accordingly, establish an operational state of the controlled device 112. An example of an FOU may be a switch or a transistor, such that a control signal applied by a control line may cause the switch or transistor to be in a conducting state or a non-conducting state, for instance. The controller 100 is configured to accept an input value, e.g., a binary input value, at an input interface 120 and correlate the input value to an arbitrary set of control line signals that the controller 100 provides at the control outputs 110 to establish an operating mode, status, or characteristic of the electronic device. The desired operating mode, status, or characteristic is therefore identified by the input value.

In conventional devices, a controller such as the controller 100 of FIG. 1 may be implemented as logic that is specially designed to generate control line signals based upon a received input value at the control input interface 120. Such may be designed with relatively low effort when the number of states and the number of control lines are relatively few, but dedicated logic becomes exponentially more complex to design as the number of states or the number of control lines is increased. For example, a device may have four unique control lines that support eight different operational states established by various combinations of signals provided on the control lines by a controller. Such an 8-state controller needs only a 3-bit binary input to uniquely identify the eight states, because, e.g., $2^3=8$. Dedicated logic may be relatively easily designed to provide particular signals on each of the four control lines under the circumstance of receiving a particular 3-bit input value. Scaling such a dedicated logic design to a more complex example of a controlled device 112 having, for example, 46 operating states established via 24 control lines, thereby requiring a 6-bit input interface, may be significantly more complex, time-consuming, expensive, and may not be straightforward. Generally, an entirely different logic design is required. Once a more-complex logic controller is designed, it may require costly re-work if a different mapping to operational states is desired (e.g., if different customers want parts having different operational states), or if the control line signals for one of the operational states needs to be changed, or if a design error is discovered in the control logic. Such a fixed dedicated logic design for a controller is not easily re-configurable.

With continued reference to FIG. 1, the controller 100 provides signals on the control outputs 110 based upon a received input value at the input interface 120. The controller 100 includes k control outputs 110 and supports an n-bit input value at the input interface 120. As shown, n=6 and k=12, but it should be appreciated that a controller may provide any number of control outputs and any input word size desirable to support various applications and changing operational requirements. In particular, to control a device that may support 'm' number of operating states, a controller should accommodate an n-bit input word size, where n is loge m rounded up to the nearest integer, to support enough unique binary values to identify each of the 'm' operating states. It should also be appreciated that while the input interface 120 is shown as an n-bit parallel interface, the input interface 120 may be parallel or serially arranged, analog or digital, binary or otherwise, and or any combination of these or other suitable interface formats. The input interface 120 of a controller may conform to various interface specifications as required by application or operational parameters.

Figure 2:
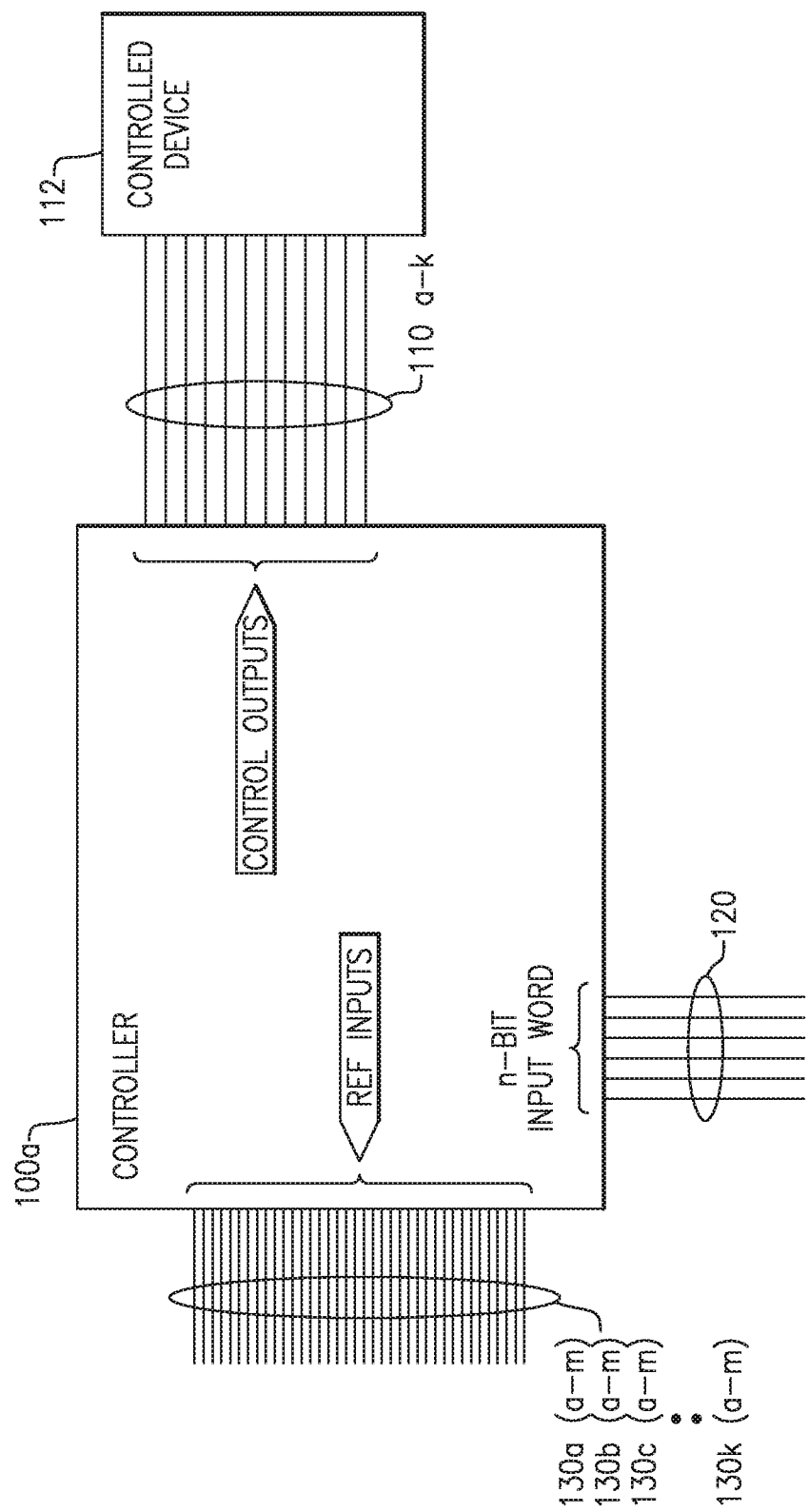
FIG. 2 is a schematic diagram of an example configurable controller.

FIG. 2 shows a configurable controller 100a that also has control outputs 110 and an input interface 120, and includes reference inputs 130 that act as reference signals for the control outputs 110. The configurable controller 100a maps reference signals from the reference inputs 130 to provide control signals at the control outputs 110, based upon the input value received at the input interface 120, which identifies a desired operational state of the controlled device 112. The configurable controller 100a is configurable because the signals provided to the reference inputs 130 may be altered, as described in more detail below, for example, at manufacture, by programming, or other methods, for example by writing values into a memory, by writing values into registers, or other methods of altering the signals received at the reference inputs 130.

Figure 3:
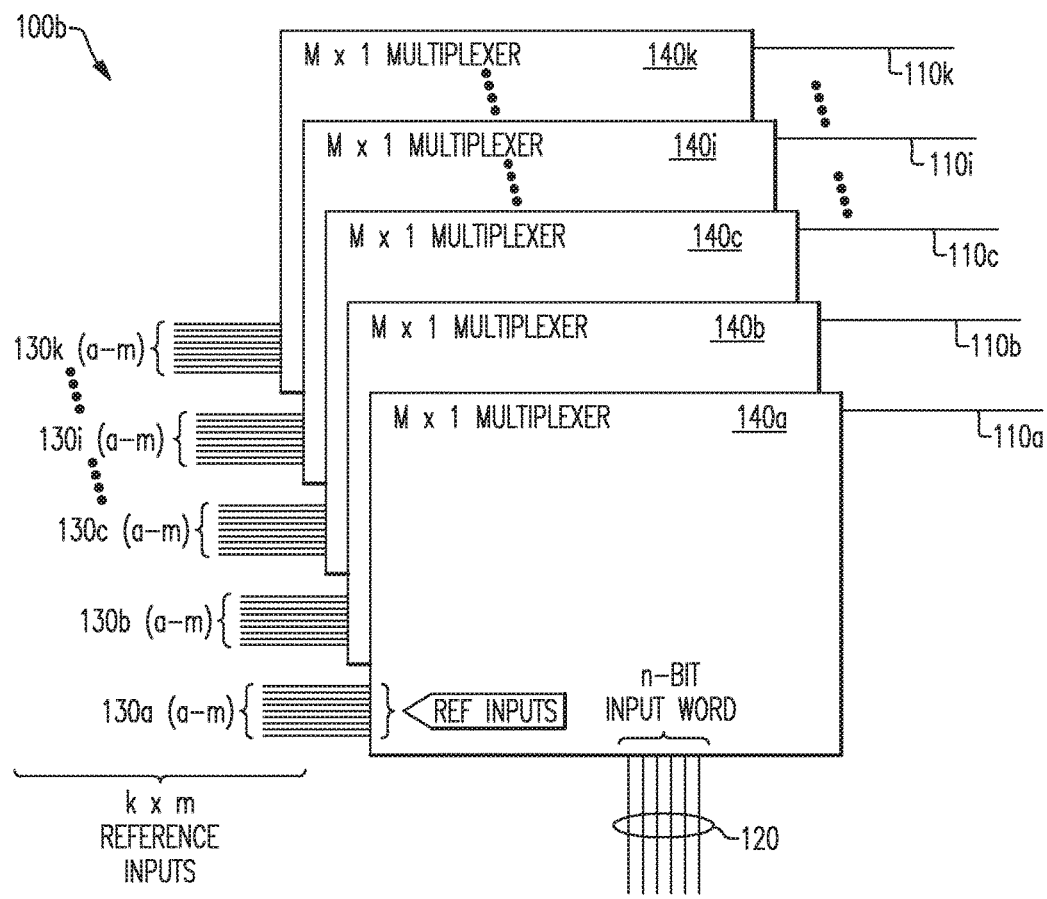
FIG. 3 is a schematic diagram of another example configurable controller.

In at least one embodiment, the controller 100a includes one or more multiplexers, as shown, for example, in FIG. 3. FIG. 3 shows a controller 100b that provides k control outputs 110 to provide control signals to establish a particular operational state based upon a value received at the input interface 120. The controller 100b establishes one of m≤2$^n$ states of the device by associating at least one reference input 130 to a control output 110, through incorporation of a number of multiplexers. In the example controller 100b, there are k multiplexers 140, one for each of the k control outputs 110. For clarity, focusing on the single multiplexer 140a, which drives the signal provided on the control output 110a, the multiplexer 140a may need up to m reference inputs 130a to support m states of the device. For example, if the device being controlled supports eight operational states, the multiplexer 140a may be provided with eight reference inputs 130a so that when any particular operational state is selected (e.g., by an n-bit binary value received at the input interface 120) the multiplexer selects a corresponding reference input 130a from which to provide the signal on the control output 110a. Accordingly, for an m-state controller 100b, each multiplexer may be an m:1 multiplexer having m reference inputs 130. Additionally, for k multiplexers, each multiplexer driving one of k control outputs, the controller 100b may have a total of k×m reference inputs 130.

With continued reference to the example controller 100b of FIG. 3, each of the multiplexers 140 may be designed and fabricated through conventional logic design techniques. An m:1 multiplexer may be designed and fabricated from multiple lower order multiplexers, such as multiple 2:1 multiplexers, for example. There are a number of designs for multiplexers in the art, and any arrangement of circuit elements capable of selecting a particular input (e.g., a reference input 130) to provide an output (e.g., a control output 110) based on a received value (e.g., received at the input interface 120) may act as a suitable multiplexer according to examples and embodiments of controllers described herein.

Further, a controller in accord with those described herein may include more or fewer reference inputs than that described above. For example, a controller may be provided with a full range of reference inputs to support 2$^n$ states even though the controller may be implemented to control a device having fewer, e.g., m, operational states. Similarly, a controller may have fewer than m reference inputs per multiplexer if, for example, some of the m states are redundant and accordingly, or for other reasons, fewer reference inputs are necessary. Additionally, some of the reference inputs may be tied together such that the controller overall appears to have fewer reference inputs though the internal circuit design maintains a larger number of reference inputs.

At least one benefit of a controller design of, for example, the controllers 100a, 100b having reference inputs 130 is that the signals provided on the k control outputs 110 may be more easily configured, and later altered if necessary, than conventional controller designs. A conventional controller design may require complete re-design if one or more input values are desired to establish a different operational state than originally desired, or are otherwise desired to apply a different set of signals on the control outputs. For example, similar electronic devices provided to different customers may desire differing operational states according to a set of unique input values. Another example is if an error is discovered and a signal provided at one or more control outputs needs to be changed. In the controller designs of, for example, the controllers 100a, 100b, associations of input values to control output signals, and accordingly to operational states, may by changed simply by changing the signals provided on the reference inputs 130, which may be accomplished in numerous ways as described in more detail below.

Figure 4:
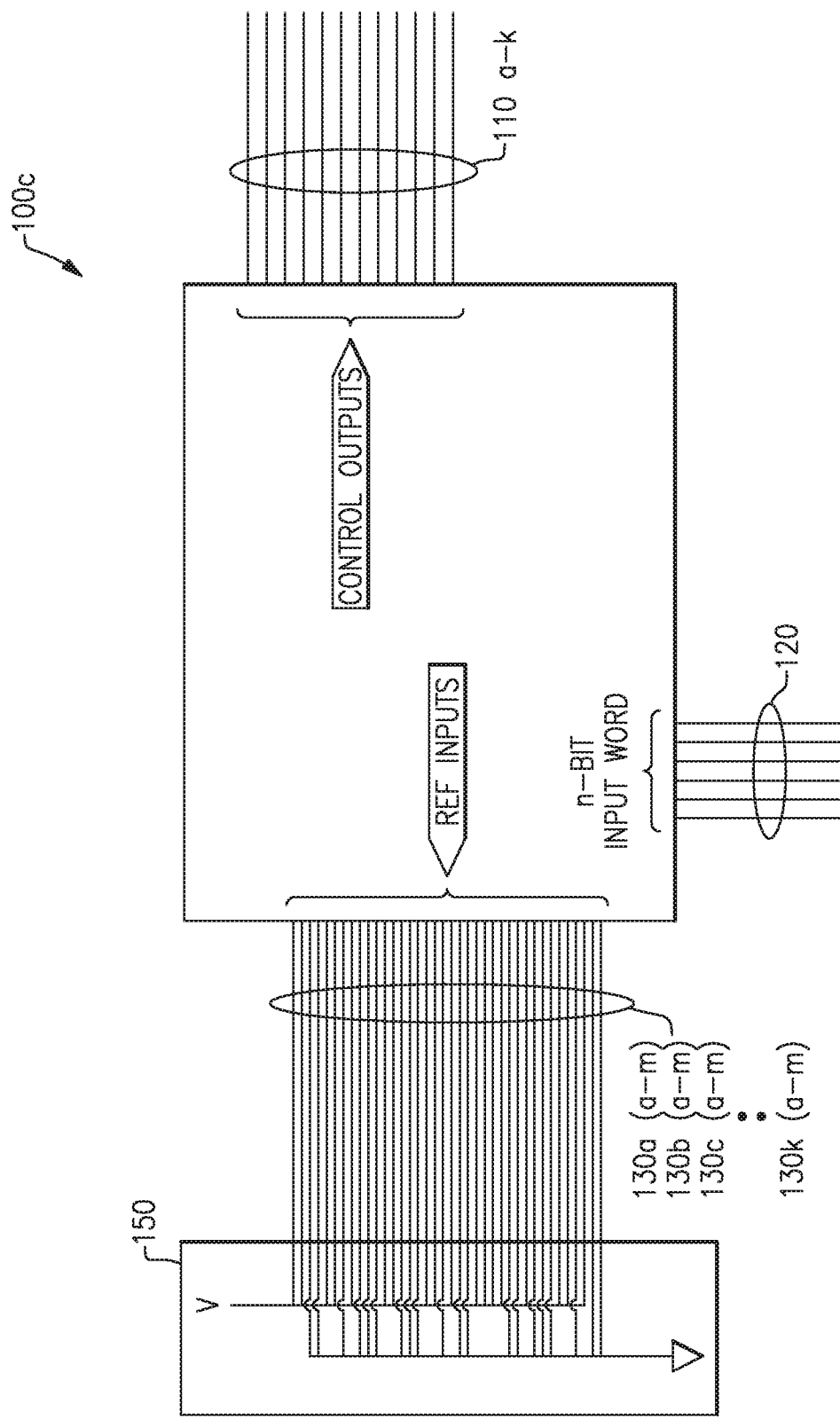
FIG. 4 is a schematic diagram of another example configurable controller.

FIG. 4 illustrates a controller 100c having each of the reference inputs 130 tied to a reference source 150. The reference source 150 may include, for example, connections to a voltage supply rail or to ground as shown. Each of the controllers 100a, 100b, 100c selects individual reference inputs 130 to provide signals at control outputs 110 based upon a value received at the input interface 120. Accordingly, a signal provided at each of the control outputs 110 depends upon which of the reference inputs 130 are selected and, for the controller 100c, whether the selected reference inputs 130 are tied to, for example, the voltage supply rail or ground. The reference inputs 130 may be tied to the voltage supply rail or to ground by hard wiring. For example, in the fabrication of a semiconductor device there will be steps that include placing conductors, e.g., metal or wire, between components, and the reference inputs 130 may be connected to the voltage supply rail or to ground as part of such a fabrication step. Additionally, if it is desired to change the mapping between input values and control output signals (and accordingly a change of operational state of the controlled device), the metal wiring step of the fabrication process is all that need be changed. In conventional controller designs, the underlying control logic may have needed to be changed, requiring multiple layers of a wafer or die manufacturing process to be re-designed at significant expense.

Figure 5:
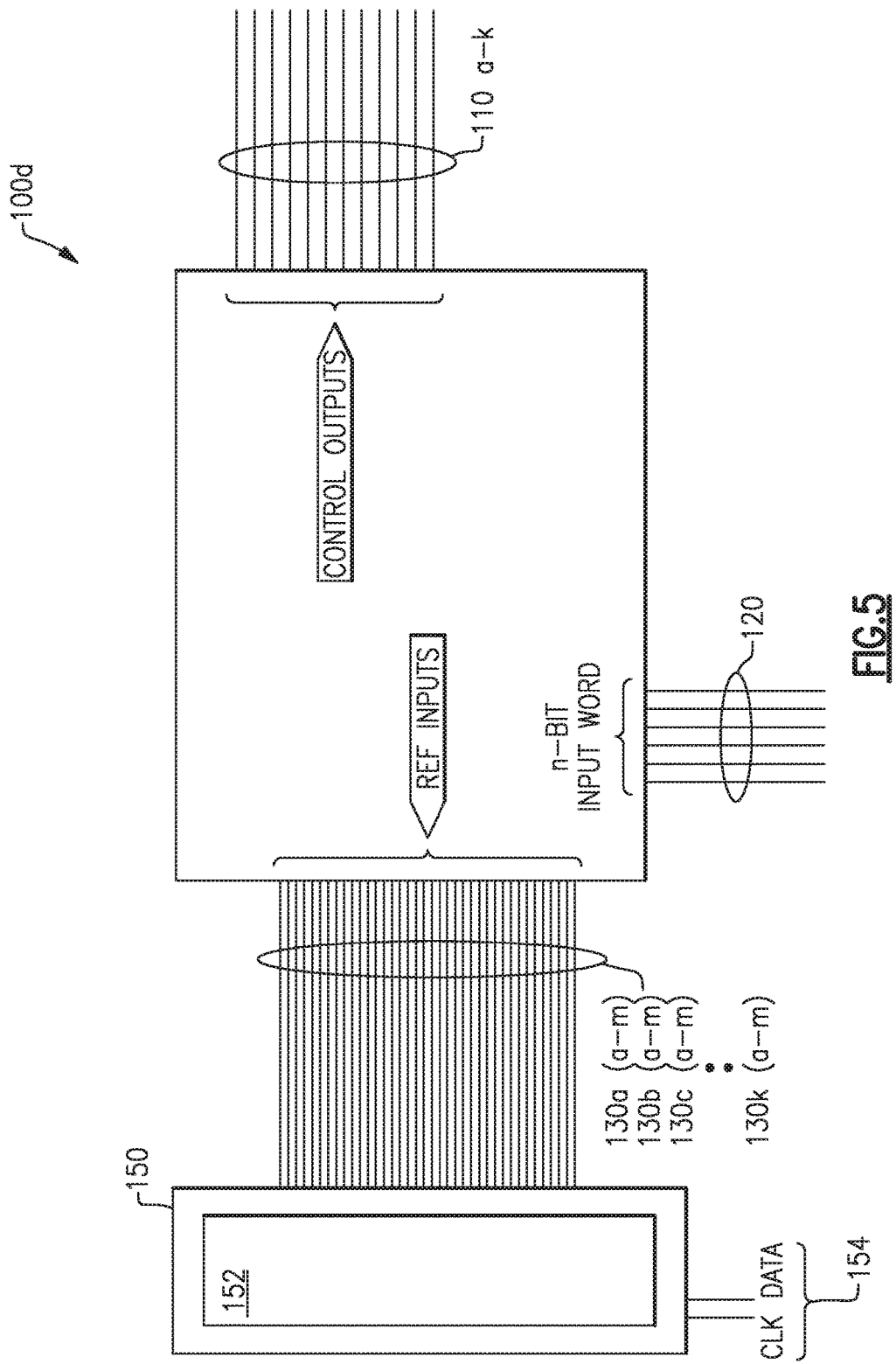
FIG. 5 is a schematic diagram of another example configurable controller.

FIG. 5 illustrates a controller 100d having each of the reference inputs 130 coupled to a reference source 150 that is a register. The register reference source 150 is a memory 152 that stores values to provide to the reference inputs 130. The memory 152 may also have an interface 154 to allow programming of the memory 152, for example to change the values stored therein. For the example of a controller 100d, if it is desired to change the mapping between input values and control output signals (and accordingly a change of operational state of the controlled device), it is only required to change the values stored in the memory 152. Accordingly, in this example of a controller, the mapping between an n-bit input value and the operational state of a controlled device may be changed by changing the stored values in the register reference source 150 without making any hardware changes to the controller.

Figure 6:
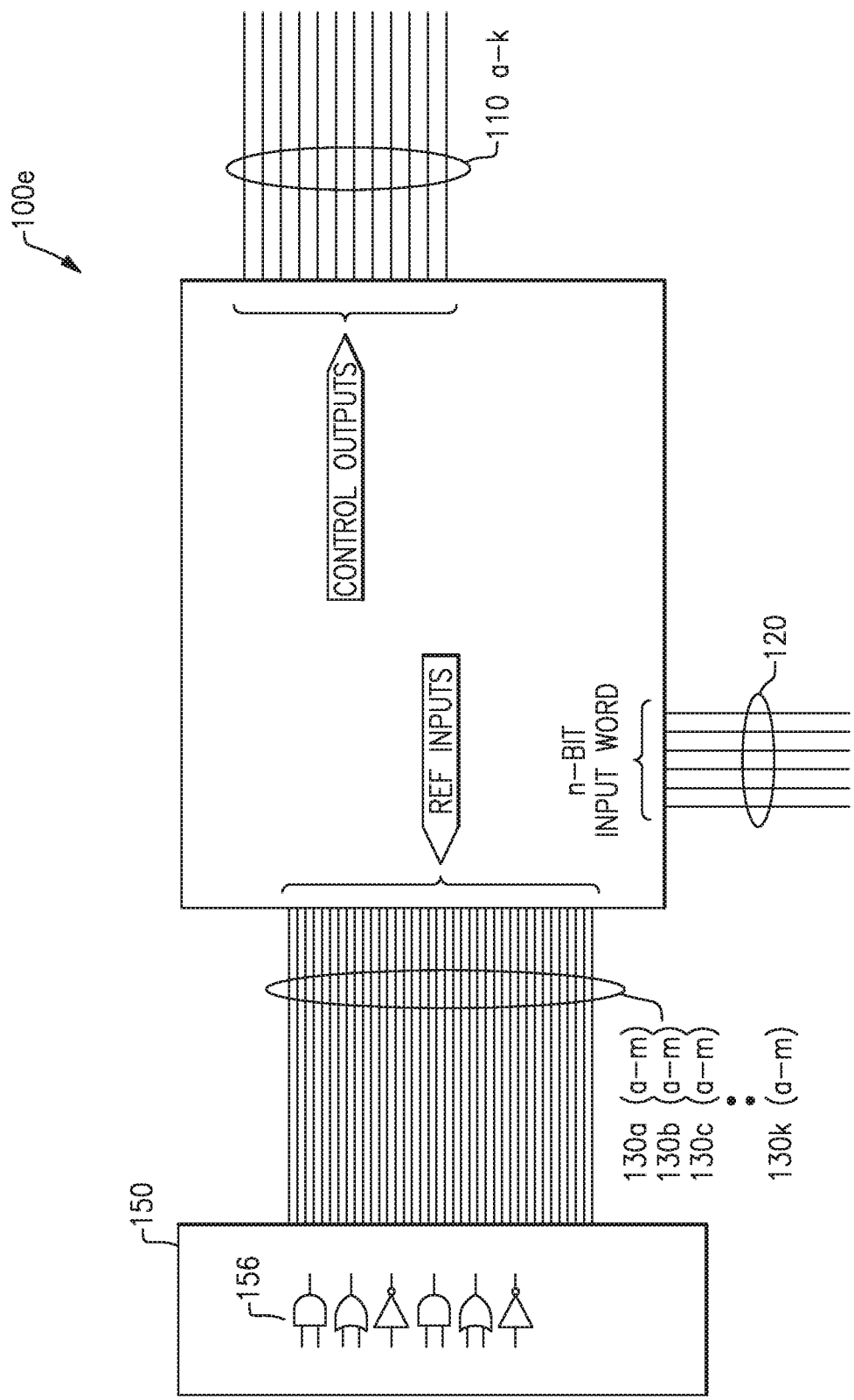
FIG. 6 is a schematic diagram of another example configurable controller.

FIG. 6 illustrates a controller 100e having each of the reference inputs 130 coupled to a reference source 150 that includes combinatorial logic 156. For simplicity, the details of the combinatorial logic 156 are not shown, as the combinatorial logic 156 may be any desired and suitable logic according to requirements or applications. For example, a device being controlled by the controller 100e may have varying requirements or operational states, established via the control outputs 110, which depend upon conditions, factors, or other aspects of the device or the environment. For example, a particular operational state identified by a particular n-bit value received at the n-bit input may depend upon whether a temperature is above or below a threshold, or there may be some dependence upon whether a value or a voltage is at a sufficient operating level, or upon whether a time delay or limit is satisfied, or any number of dependencies may be built into the combinatorial logic 156 upon which the control output 110 signals may need to differ for a given n-bit input value.

The reference inputs, such as reference inputs 130, of a controller, such as any of the controllers 100a, 100b, 100c, 100d, 100e, may be coupled to a reference signal by any of wiring, registers, memory, logic, or any combination of these, and are not limited to the particular coupling of the reference inputs 130 as shown.

A controlled device may be any device having elements capable of multiple states and the states of which elements determine an operational state of the device. For example, a digital switched attenuator may have switches whose states are controlled by control lines that establish attenuation components to be part of a signal path or not to be part of the signal path, and accordingly control an amount of attenuation provided. A signal coupler may have switches whose states are controlled by control lines and establish whether the coupler is operating in a forward or reverse state, or whether the coupler is coupling one frequency band or another, or the like. An adjustable impedance may have switches controlled by control lines and establish impedance elements coupled to a terminal. A filter may have controlled elements that establish cutoff frequencies and/or bands to be passed or rejected. A signal output may be provided with selectability to provide one signal or another by control of one or more elements whose states are controlled by a control line. An electronic device controlled by aspects and embodiments disclosed herein may further include indicators, such as audible and visual indicators, controlled by control lines, or may include elements, such as amplifiers, processors, or other logic, and the like, whose functions are enabled or disabled by control lines, or may be powered by control lines, etc. Other examples of controlled elements may include various delay blocks, filters, multipliers, amplifiers, gain cells, frequency multipliers, oscillators, etc., as well as other linear or non-linear elements, and in some cases may include physical or mechanical aspects or elements, such as micro-electromechanical systems (MEMS), valves, actuators, etc. Any such controlled element may be considered a functional operating unit (FOU) in accord with aspects and examples described herein. Any of these example or other functional operating units (controlled elements) may, through their individual operational status, establish an operational state of a controllable device, and the individual operational status of the FOU's may be controlled in accord with aspects and embodiments of the controllers described herein. Those skilled in the art will identify numerous additional examples of controllable devices suitable for control by aspects and embodiments of controllers disclosed herein.

Figure 7:
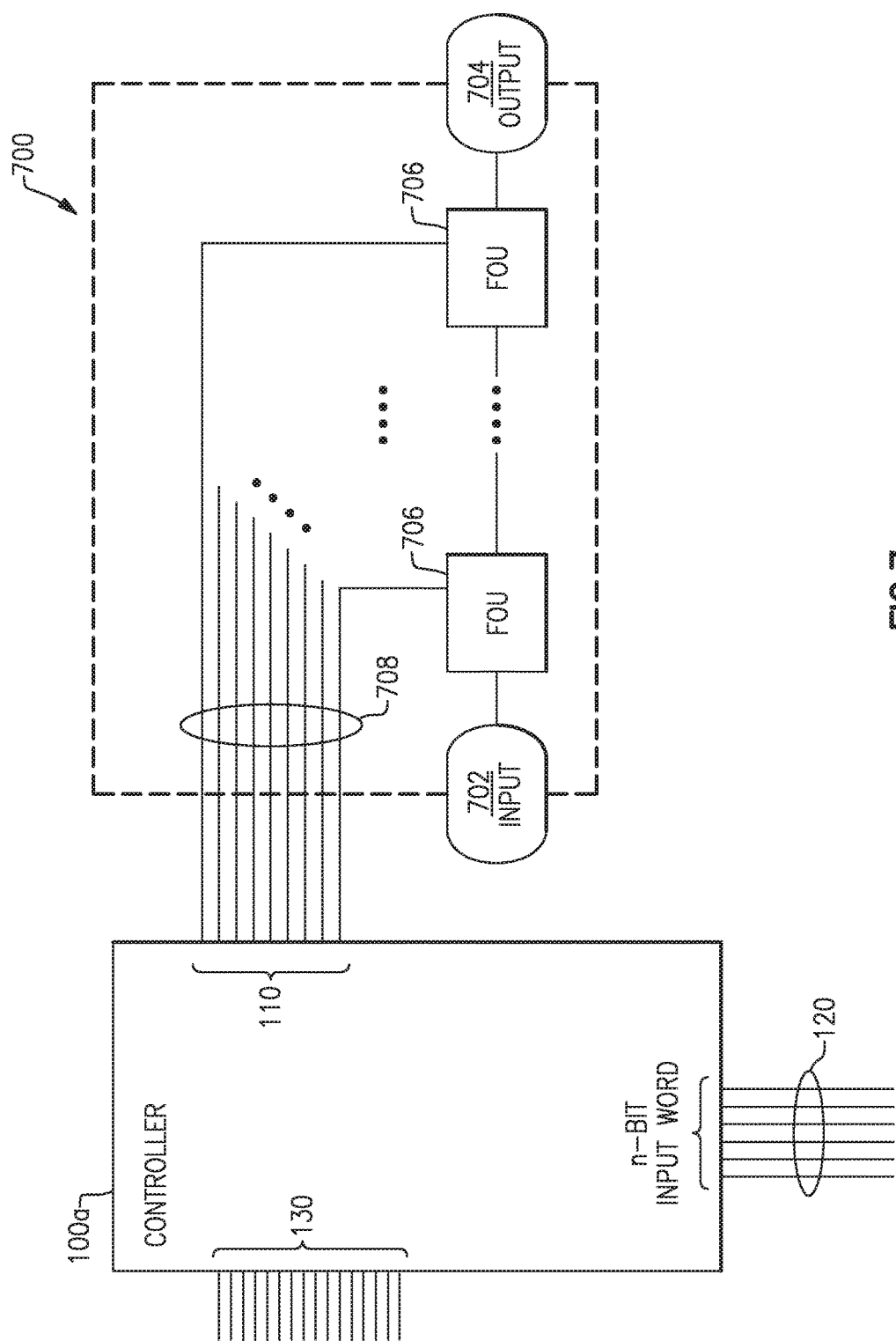
FIG. 7 is a schematic diagram of an example configurable controller coupled to a controlled device.

An example illustrating control of a number of FOU's of a controlled device is illustrated in FIG. 7. A controlled device 700 may be controlled by a controller 100a in accord with aspects and embodiments disclosed herein. For example, the controlled device 700 may include a number of FOU's 706 that may functionally operate upon, e.g., a signal received at an input 702 to provide a signal at an output 704. For example, the controlled device 700 may be a digital switched attenuator and each of the FOU's 706 may be an attenuation cell that provides selective attenuation to a radio frequency signal. In such example, each of the FOU's 706 may have a control line 708 that controls switches to cause the FOU 706 to either attenuate the signal (an attenuation mode) or allow the signal to pass without attenuation (a bypass mode). In this manner a digital switched attenuator (e.g., the controlled device 700) may provide varying levels of attenuation by varying combinations of FOU's 706 in attenuation or bypass modes.

For the example of FIG. 7, there may be any number of FOU's 706 and accordingly any number of control lines 708. Additionally, as an example of the controlled device 700 being a digital switched attenuator, the controlled device 700 may be implemented to support 36 different attenuation states. For example, 35 of the states may each provide a particular integer value of attenuation from 0-34 dB, and the 36$^{th}$ state may be an isolated state wherein the controlled device 700 provides a substantially open circuit. To account for the 36 possible states, the controller 100a may accept a 6-bit binary input word size at an input interface 120. It should be appreciated that a 5-bit binary word accommodates only up to 32 unique values, thus a 36-state device, such as this example of a controlled device 700, uses a 6-bit binary word to uniquely identify each of the 36 possible states. It should also be appreciated that a 6-bit binary word can accommodate a unique identifier for up to 64 different states, but in this example the additional 28 unique identifiers may either not be used, or may be redundantly associated with one of the 36 states.

In various embodiments, an example of a controlled device 700 may include a number of FOU's 706 that may be, e.g., interconnected serially to process a signal from an input 702 to an output 704. Other embodiments of the controlled device 700 may include parallel operation of FOU's 706, and a number of FOU's 706 may take any of numerous arrangements, and the controlled device 700 may include a complex arrangement of FOU's 706 that provide various functional operation in varying orders of operation, to operate on signals or other elements. The controlled device 700 may be any device capable of two or more operational states, by virtue of controlling at least one functional operating unit within the device, and controllers and methods in accord with aspects and examples described herein may serve as suitable control for a controlled device 700 of any level of complexity regarding the FOU's 706 and their arrangement within the controlled device 700.

The controller 100*a* of FIG. 7 may be any of the above described embodiments of a controller, and the controller 100*a* associates a 6-bit input value to an appropriate set of signals on the control outputs 110, which are accordingly coupled to the control lines 708 of the controlled device 700, to place each of the FOU's 706 into a configuration to provide the desired state. As described above, the controller 100*a* of FIG. 7 may select, based upon the 6-bit input value, from among multiple reference inputs 130 as a reference for the signal to be provided at one or more of the control outputs 110, and the reference inputs 130 may be coupled to a reference source (e.g., reference source 150), internal or external to the controller 110, that may for example include direct ties to one or more reference voltages, coupling to values in a register or memory, or logic-based signals, or any combination of these or other suitable reference sources.

In the above described examples there may be more possible combinations of control line signals than there are valid operational states. Indeed, there are typically combinations of control line signals that are undesired, invalid, or may even be dangerous to the device, such as by causing short circuits or overheating, for example. Accordingly, a controller in accord with aspects and embodiments disclosed herein may be configured to prevent certain combinations of control output signals, or otherwise to not support all possible combinations of control output signals. Similarly, each unique value of an input word may or may not correspond to a valid operational state, but aspects and embodiments of controllers disclosed herein may easily associate otherwise unused input values with redundant operational states, a default state, an off state, or other states as desired.

In accord with aspects and examples described herein, a change in mapping between input values and operational states of a controlled device may be easily accommodated. A set of control output signals corresponds to an operational state of the controlled device, and the mapping of input values (e.g., via the input interface 120) to a set of control output signals is easily established via wiring (e.g., see FIG. 4), via registers (e.g., see FIG. 5), via logic (e.g., see FIG. 6), or other techniques. A change in mapping may therefore be easily accommodated by, e.g., changing a metal write step in the fabrication process, or writing new values to a register, or other techniques. In various examples, a different part number may require, or a different customer may desire, different operational states to be available, or may desire different input values to be associated with the various operational states. According to aspects and embodiments described herein, a change to reference signals may be sufficient to provide such variations, at least because a change to reference signals may be easily accommodated as variously described above.

Aspects and embodiments of controllers disclosed herein may be provided in substrates or on dies, or as packaged modules having input interfaces and control outputs as disclosed. Such embodiments may provide reference inputs for connection to external reference sources, or reference sources may be included with such embodiments, or any combination thereof. Aspects and embodiments of controller disclosed herein may also be provided in substrates, dies, or packaged modules, in combination with the controlled device. For example, digital switched attenuators, radio frequency couplers, antenna switch modules, amplifiers or amplifier assemblies, adjustable signal filters, adjustable impedances, and the like, all may be provided with various controllers as disclosed herein, as chips or dies, front end modules, multi-chip modules, etc. Accordingly, any number of products, such as communication devices, wired or wireless, analog or digital, packetized or otherwise, may incorporate various controllers in accord with aspects and embodiments disclosed herein to provide configurable control of one or more electronic devices, circuits, sub-assemblies, etc., incorporated therein.

Figure 8:
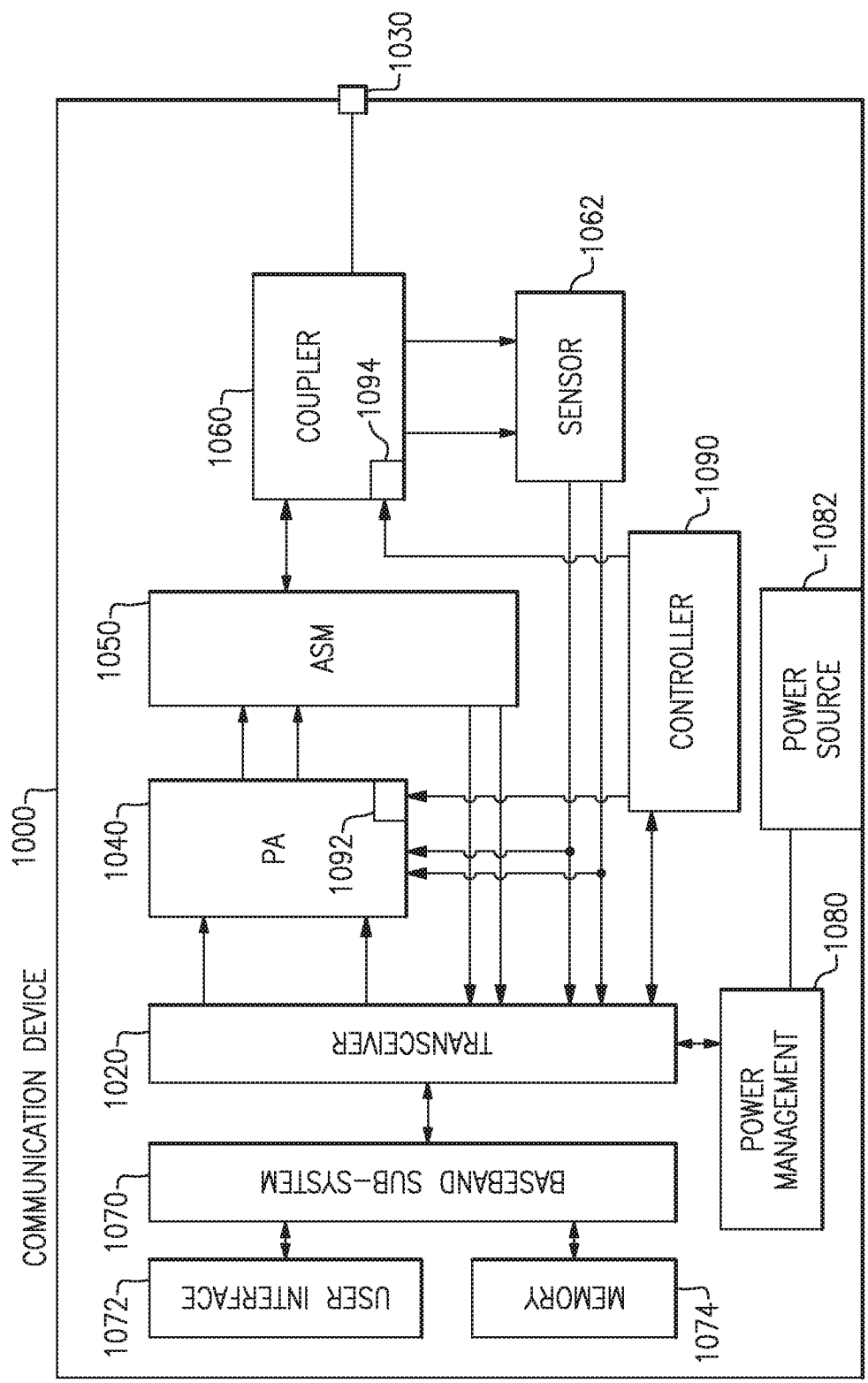
FIG. 8 is a schematic diagram of an example device including one or more configurable controllers.

Aspects and embodiments of controllers disclosed herein may be provided within an electronic device. One example of an electronic device includes a communications device 1000 as shown in FIG. 8. The communication device 1000 can have one or more controllers in accordance with any of the principles and advantages discussed herein. The example communication device 1000 may be a wireless device, such as, for example, a mobile phone, a smart phone, a tablet, a wireless access point, a router, a modem, an end point, or the like, or may be a wired device, such as, for example, a cable modem, a set top box, or the like, or may be a combination of a wired and wireless device. A communication device may include additional elements not shown in FIG. 10 and/or may include a sub-combination of those elements shown.

The communication device 1000 includes an external interface 1030, to which a communication cable or an antenna, for example, may be connected for transmitting and receiving communication signals, such as radio frequency (RF) signals. A coupler 1060 may provide to a sensor 1062 a coupled signal of the RF signal going to or from the interface 1030, for monitoring and adjusting power levels and/or mismatch characteristics. A switch module 1050 may control or direct received RF signals from the interface 1030 to a transceiver 1020, and control or direct RF signals from a power amplifier 1040 to the interface 1030. The transceiver 1020 may be controlled by a baseband sub-system 1070 having a user interface 1072 and a memory 1074, and the example communication device 1000 may have a power management system 1080 and a power source 1082, such as a battery or a power supply.

One or more controllers in accord with those disclosed herein may be incorporated in one or more of the various sub-components of the communication device 1000. For example, the communication device 1000 may include a controller 1090 in communication with, and providing control for, any of numerous of the various components, such as the transceiver 1020, the power amplifier 1040, and the coupler 1060, as shown. The power amplifier 1040, for example, may include a controller 1092 in accord with those described herein. The controller 1092 may receive input values from the controller 1090 and may map reference signals to control output signals based on the input values received, and the control output signals may control aspects of the power amplifier 1040 (such as attenuation, switching, amplifier gain, and other components) to establish a particular operational state of the power amplifier 1040. Similarly, the coupler 1060, for example, may include a controller 1094 in accord with those described herein. The controller 1094 may receive input values from the controller 1090 and may map reference signals to control output signals based on the input values received, and the control output signals may control aspects of the coupler 1060 (such as attenuation, directionality, switching, and other components) to establish a particular operational state of the coupler 1060 Likewise, any of various other components of the communication device 1000 may include a controller in accord with those described herein.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A configurable controller for establishing desired operational modes of a device having a plurality of functional operating units, the controller comprising:
   an input configured to receive an identifier of a desired operational mode of the device;
   a plurality of reference inputs, each reference input being configured to receive a reference signal, the reference signal being pre-configured to have one of a first value and a second value based on the desired operational mode of the device; and
   a plurality of control outputs, each control output being mapped to one reference input of the plurality of reference inputs based on the identifier, each control output being coupled to one or more of the functional operating units and configured to provide a control signal that places the one or more functional operating units in a selected operating state of at least two operating states to achieve the desired operational mode of the device.

2. The controller of claim 1 wherein a multiplexer provides one or more of the plurality of control outputs.

3. The controller of claim 1 wherein one or more of the plurality of reference inputs is coupled to a reference source that is external to the controller.

4. The controller of claim 3 wherein the reference source is at least one of a reference potential, a register, a memory, and a logic circuit.

5. The controller of claim 3 wherein the reference source is configured to provide one of the first value and the second value for each reference signal.

6. The controller of claim 5 wherein the desired operational mode of the controller is reconfigured by changing the provided value for at least one reference signal from the first value to the second value or from the second value to the first value.

7. A configurable controller for establishing desired operational modes of device having a number of control lines, comprising:
   a plurality of reference inputs configured to receive a reference signal, the reference signal being pre-configured to have one of a first value and a second value based on a desired operational mode of the device;
   a plurality of multiplexers corresponding in number to the number of control lines, each multiplexer configured to provide a control signal to one of the control lines based upon the reference signal received at a selected reference input; and
   a control input to receive an identifier of the desired operational mode of the device, the control input coupled to each of the plurality of multiplexers to select the selected reference inputs based on the identifier.

8. The controller of claim 7 wherein one or more of the plurality of reference inputs is coupled to a reference source that is external to the controller.

9. The controller of claim 8 wherein the reference source is at least one of a reference potential, a register, a memory, and a logic circuit.

10. The controller of claim 8 wherein the reference source is configured to provide one of the first value and the second value for each reference signal.

11. The controller of claim 10 wherein the desired operational mode of the controller is reconfigured by changing the provided value for at least one reference signal from the first value to the second value or from the second value to the first value.

12. A method of making a controller for a device having a plurality of control lines, comprising:
   selecting an m-to-1 multiplexer, where m is greater than or equal to a number of desired operational modes of the device;
   replicating, within the controller, the m-to-1 multiplexer k times, where k is a number of control lines in the plurality of control lines;
   configuring, a reference source external to the controller to provide m input reference signals to the controller for each m-to-1 multiplexer based on the desired operational modes of the device; and
   providing the m-to-1 multiplexers in a group configured to control the electronic device.

13. The method of claim 12 further comprising coupling an output of each of the m-to-1 multiplexers to one of the plurality of control lines.

14. The method of claim 12 further comprising coupling one or more inputs of each of the m-to-1 multiplexers to the reference source.

15. The method of claim 12 wherein the reference source is at least one of a reference potential, a register, a memory, and a logic circuit.

16. The method of claim 12 wherein providing the m-to-1 multiplexers in a group includes packaging the m-to-1 multiplexers, the packaging providing an output of each of the m-to-1 multiplexers and a first input coupled to a control input of each of the m-to-1 multiplexers.

17. The method of claim 16 wherein packaging the m-to-1 multiplexers includes providing a plurality of second inputs, each of the second inputs coupled to one or more inputs of each of the m-to-1 multiplexers.

18. A method of controlling desired operational modes of a device having a plurality of control lines, comprising:
   receiving an identifier that identifies a desired operational mode of the device;
   selecting a reference signal from among a plurality of reference signals based upon the identifier, the reference signal having a pre-configured value that is one of a first value and a second value based on the desired operational mode of the device; and
   providing a control signal to one of the control lines based upon the selected reference signal.

19. The method of claim 18 wherein providing a control signal to one of the control lines includes coupling the selected reference signal to the control line.

20. The method of claim 18 further comprising reconfiguring the desired operational mode of the device by changing the pre-configured value of the reference signal from the first value to the second value or from the second value to the first value.

\* \* \* \* \*

UNITED STATES PATENT AND TRADEMARK OFFICE
CERTIFICATE OF CORRECTION

PATENT NO. : 10,476,507 B2  
APPLICATION NO. : 16/256185  
DATED : November 12, 2019  
INVENTOR(S) : Adrian John Bergsma Page 1 of 1

It is certified that error appears in the above-identified patent and that said Letters Patent is hereby corrected as shown below:

In the Specification

Column 5, Line 16, delete "loge" and insert -- $\log_2$ --.

Signed and Sealed this  
Twenty-fourth Day of December, 2019

Andrei Iancu  
*Director of the United States Patent and Trademark Office*